United States Patent
Heinen et al.

(10) Patent No.: US 7,620,515 B2
(45) Date of Patent: Nov. 17, 2009

(54) INTEGRATED CIRCUIT WITH BIT ERROR TEST CAPABILITY

(75) Inventors: Martin Heinen, Bondorf (DE); Joachim Moll, Herrenberg (DE)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/557,104

(22) PCT Filed: Jul. 15, 2003

(86) PCT No.: PCT/EP03/50307

§ 371 (c)(1),
(2), (4) Date: Nov. 27, 2006

(87) PCT Pub. No.: WO2005/015251

PCT Pub. Date: Feb. 17, 2005

(65) Prior Publication Data

US 2007/0159234 A1    Jul. 12, 2007

(51) Int. Cl.
*G01R 31/00* (2006.01)
(52) U.S. Cl. .................................... 702/118
(58) Field of Classification Search ............ 702/57, 702/58, 65, 69, 71, 72, 74, 80, 83, 90, 118, 702/183, 189, 193; 326/38; 327/165; 375/251

See application file for complete search history.

(56) References Cited

U.S. PATENT DOCUMENTS

| | | | | |
|---|---|---|---|---|
| 4,264,974 A | * | 4/1981 | Crouse | 375/251 |
| 7,069,488 B2 | * | 6/2006 | Moll et al. | 714/736 |
| 7,263,151 B2 | * | 8/2007 | Momtaz et al. | 375/371 |
| 2003/0023912 A1 | | 1/2003 | Lesea | 714/726 |
| 2003/0031282 A1 | | 2/2003 | Mc Cormak et al. | 375/355 |

FOREIGN PATENT DOCUMENTS

| WO | WO 01/20452 | 3/2001 |
|---|---|---|
| WO | WO 01/73465 | 10/2001 |

OTHER PUBLICATIONS

"SCAN921023 and SACN921224 20-66 MHz 10 Bit Bus LVDS Serializer and Deserializer with IEEE 1149.1".

* cited by examiner

*Primary Examiner*—Edward Raymond
*Assistant Examiner*—Mohamed Charioui
(74) *Attorney, Agent, or Firm*—Marc Bobys

(57) ABSTRACT

An integrated circuit (10), preferably a field programmable gate array—FPGA or an application specific integrated circuit—ASIC—, comprises a level comparator (30) for comparing a level of a comparator input signal and correspondingly providing a comparator output signal (COS). A sampling unit (40) is coupled to the level comparator (30) for sampling (SAM) the comparator output signal (COS). A bit error test unit (60) receives the sampled comparator output signal (SAM) and determine therefrom an indication of a bit error in a sequence of the sampled comparator output signal (SAM).

10 Claims, 1 Drawing Sheet

_US 7,620,515 B2_

INTEGRATED CIRCUIT WITH BIT ERROR TEST CAPABILITY

BACKGROUND OF THE INVENTION

The present invention relates to integrated circuits.

Integrated circuits (ICs), such as field programmable gate arrays (FPGA) or application specific integrated circuits (ASIC), usually comprise an input unit (also referred to as input cell or input block) to receive an input signal from external with respect of the integrated circuit, a processing unit (also referred to as logic core) to receive and process the sampled comparator output signal, and an output unit to receive a data signal from the processing unit, to derive therefrom an output signal, and to provide the output signal to external with respect of the integrated circuit. The input unit generally comprises a level comparator for comparing the level of the input signal and correspondingly providing a comparator output signal, and a sampling unit (e.g. flip-flop) coupled to the level comparator for sampling the comparator output signal. Typically, the IC has multiple input units and/or multiple output units but may also only have one input and/or output unit.

SUMMARY OF THE INVENTION

It is an object of the invention to provide an improved integrated circuit. The object is solved by the independent claims. Preferred embodiments are shown by the dependent claims.

According to the present invention, a bit error test unit is provided for bit error testing using already existing facilities of the integrated circuit. The invention thus allows providing bit error testing directly and within the IC, so that the testing actually 'sees' what the IC 'sees' e.g. in contrast to having to wire out dedicated measuring points e.g. onto a printed circuit board (PCB) carrying the IC. Accuracy of the bit error testing can thus be increased. Using already existing facilities of the integrated circuit also reduces signal influencing by the testing itself and thus adversely affecting signal performance.

This allows to have bit error test capabilities e.g. behind every pin of an ASIC or FPGA, therefore system tests can be performed, which include the 'whole' environment of the IC, like the PCB or other circuits, which may have impact on the signal integrity of the entire system. From this follows that embodiments of the invention allow to calculate timing and/or level margins for those systems. Having this knowledge can lead to savings regarding e.g. design cycle time and NPI (new product introduction) processes.

The invention can be partly embodied or supported by one or more suitable software programs, which can be stored on or otherwise provided by any kind of data carrier, and which might be executed in or by any suitable data processing unit. Software programs or routines are preferably applied in order to process the collected data from the bit error test and e.g. display the results preferably as bit error test scan, eye diagram or spectral jitter curve.

MORE DETAILED DESCRIPTION OF PREFERRED EMBODIMENTS ACCORDING TO THE INVENTION

Figure 1:
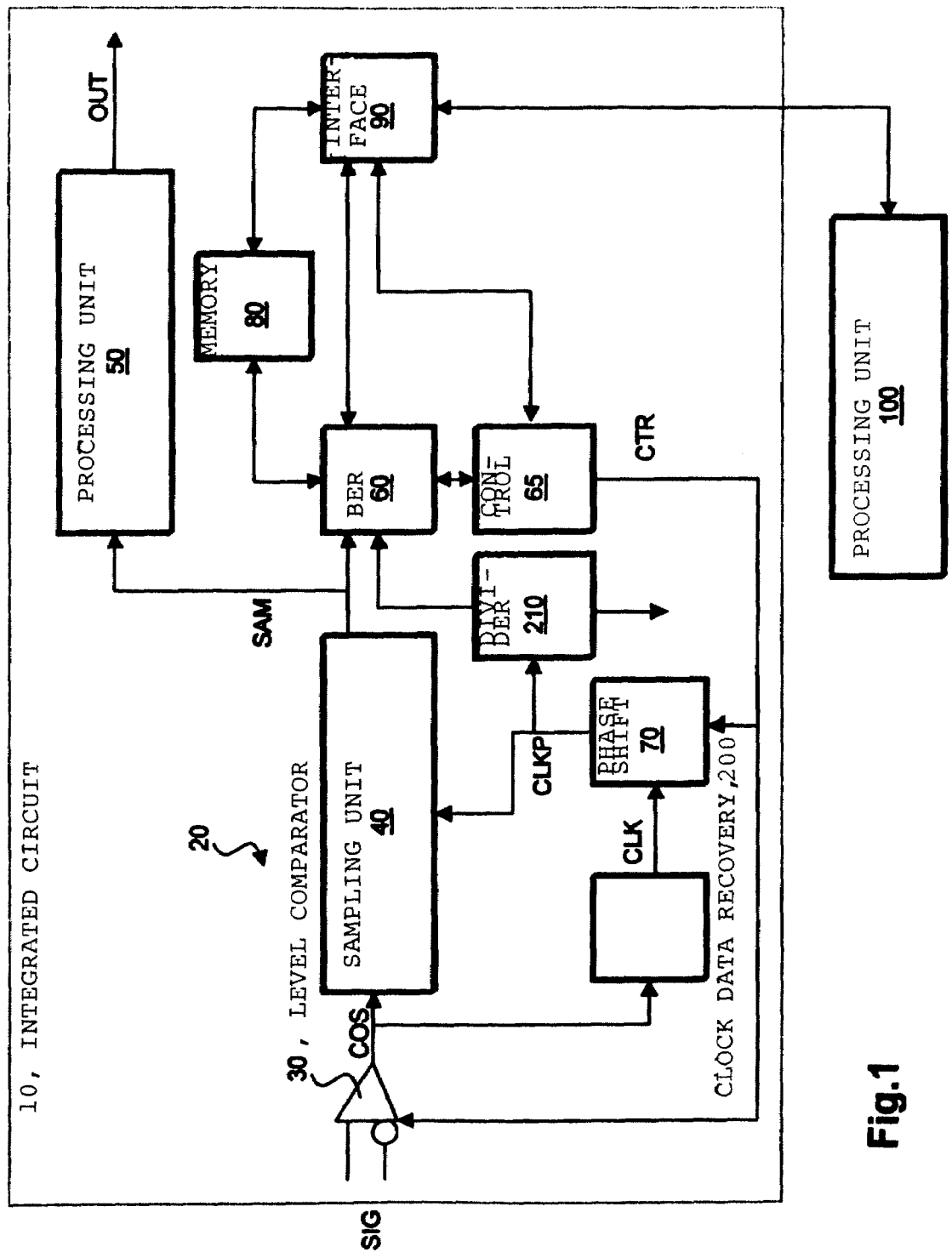
FIG. 1 is a block diagram of an integrated circuit according to an embodiment of the invention.

Other objects and many of the attendant advantages of the present invention will be readily appreciated and become better understood by reference to the following detailed description when considering in connection with the accompanied drawing.

FIG. 1 shows an example of a preferred embodiment of an IC 10 according to the present invention. The IC 10 comprises an input unit 20 to receive an input signal SIG from external with respect of the IC 10. The input unit 20 comprises a level comparator 30 for comparing the input signal SIG and correspondingly providing a comparator output signal COS to a sampling unit 40 for sampling the comparator output signal COS.

The level comparator 30 can be any circuit allowing comparing levels of signals. In case of a single-ended input signal SIG, the level comparator 30 preferably compares the input signal SIG, or a signal derived therefrom, as comparator input signal against a threshold value. Such threshold can be e.g. a reference potential, or toggle point of the input unit 20, etc.

In case of a differential input signal SIG, the level comparator 30 preferably compares a normal signal of the differential comparator input signal against a complementary signal of the comparator input signal, with the complementary signal being complementary to the normal signal. Level-shifting might be applied between the differential signals in order to change the crossing point between the normal and complementary signals.

The level comparator 30 might provide as comparator output signal COS a value (e.g. a digital '1' or 'HIGH' signal, or a digital '0' or 'LOW' signal) depending on the corresponding level comparator inputs. In case of single-ended signals, the level comparator 30 might provide as comparator output signal COS a first value (e.g. a digital '1' or 'HIGH' signal) in case the comparator input signal is greater than the threshold value and a second value (e.g. a digital '0' or 'LOW' signal) in case the comparator input signal is smaller than the threshold value. Level shifting might be applied here in order to connect the following circuits behind the level comparator (e.g. sampling unit).

A processing unit 50 receives and processes the sampled comparator output signal SAM from the output of the sampling unit 40. An output unit (not shown in the figures) receives a data signal OUT from the processing unit 50, derives therefrom an output signal (not shown in the figures), and provides the output signal to external with respect of the IC 10.

Thus, the input unit 20 receives and samples the input signal SIG for further processing by the processing unit 50, which again outputs and communicates the processed output signal OUT to external via the output unit. It is clear that input and output units can be separated (e.g. unidirectional, for example in an address bus application) or provided by a common input/output (I/O) unit (e.g. bidirectional, for example in a data bus application).

The processing provided by the processing unit can be any kind of data processing such as any combinatorial operation, retiming or just routing a signal across the IC, cross point switching, providing Arithmetic Logic Unit (ALU), providing memory cells, etc.

The IC 10 itself can be of any function or purpose as known in the art.

The sampling unit 40 might comprise double date rate (DDR) and single data rate (SDR) circuits. The phase shifting unit 70 might comprise delay locked loop (DLL) or phase locked loop (PLL) circuits or any other facility that allows variable clock data alignment (shifting) in order to change the sampling time e.g. with respect to the external (data) signal.

Further in FIG. 1, a bit error test unit 60, preferably controlled in operation by a control unit 65, also receives the sampled comparator output signal SAM and determines therefrom an indication of a bit error in a sequence of the sampled comparator output signal (SAM). For that purpose, the bit error test unit 60 might determine the number of bits within an interval from the comparator output signal SAM and the number of errors detected in the same interval. E.g. dependent on its processing abilities, the bit error test unit 60 might further determine a value of bit error rate (BER), representing the ratio of erroneous digital signals (Bits) to the total number of regarded digital signals, e.g. dividing the determined number of errors by the corresponding detected number of bits in the sampled comparator output signal SAM. The details of bit error testing are well-known in the art, as disclosed e.g. by the applicant in EP-A-1241483 and European Patent Application Nos. 02017334.0 and 02017333.2, and need not be illustrated herein. The teaching of those documents shall be incorporated herein by reference.

The bit error test unit 60 might determine the number of errors (detected for the number of bits) or the value of the bit error rate by comparing the sampled comparator output signal against an expected pattern. This expected data pattern might be derived from an internal (e.g. inside unit 60) pattern generator, can be stored in the memory 80, can be a comparator output signal provided from external (not shown), derived using a reference path as illustrated in the aforementioned European Patent Application No. 02017333.2, or derived otherwise as known in the art. The number of bits and errors are preferable determined by using accumulators and counters as known in the art.

A phase shifting unit 70 receives a clock signal CLK and provides to the sampling unit 40 a phase-shifted clock signal CLKP for controlling a sampling point of the sampling unit 40. The phase-shifting of the phase shifting unit 70 is controlled by the control unit 65 as indicated by control line CTR. For the sake of clarity it is mentioned that the phase shifting unit 70 does not necessarily have to phase-shift the clock signal in a specific measurement (i.e. representing a zero phase shift), however, allows to modify the sampling point by phase-shifting the clock signal, so that different sampling points can be selected for the bit error measurements.

The bit error indication (e.g. number of bits, the number of errors detected for the number of bits, and the value of the bit error rate) are preferably determined with respect to the sampling point (preferably representing a point in time relative to transition time of the clock signal), so that bit error measurements for sampling points be determined (e.g. for determining the so-called eye-diagram or parts thereof in the direction of the time axis).

In one embodiment, the control unit 65 further allows controlling the level of the level comparator 60, so that bit error measurements for different levels can be determined (e.g. for determining the so-called eye-diagram or parts thereof in the direction of the signal level axis).

The clock signal CLK may be provided from external of the IC 10 or generated internally by the IC 10. The clock signal CLK may also be derived from a data signal such as the input signal SIG or any other signal derived therefrom. This can be achieved using data clock recovery units as well known in the art (as will be explained later for unit 200).

In the embodiment of FIG. 1, the bit error test unit 60 is further coupled to a memory 80 allowing to buffer and/or store data provided from the bit error test unit 60. It is clear that the memory 80 might also be integral part of the bit error test unit 60.

The determined bit error test indication (e.g. number of bits of the measurement interval, the determined number of errors detected for the number of bits, and/or the determined value of the bit error rate) can be stored and/or buffered in the memory 80, e.g. for later processing or communicating to other units.

Further coupled to the bit error test unit 60, either directly or via the memory 80, preferably there is a interface unit 90, which allows to couple to an external bit error test processing unit 100 being external with respect to the IC 10. The interface unit 90 might be, for example, a Joint Test Action Group—JTAG—Boundary Scan Interface, or any other interface allowing communication with external.

The interface unit 90 is also coupled to the control unit 65 allowing to control operation of the control unit 65 e.g. by the external bit error test processing unit 100.

The interface unit 90 might also communicate to the external bit error test processing unit 100 e.g. status information of the bit error test unit 60, the determined number of bits, the determined number of errors detected for the number of bits, or the determined value of the bit error rate. The interface unit 90 might also receive control signals from the external bit error test processing unit 100 allowing controlling and initiating operation of the bit error test unit 60 (as indicated by the arrow from the interface unit 90 to the bit error test unit 60.

In case of high speed applications, the sampling unit 40 can be embodied by a deserializer for deserializing the (high speed) comparator output signal COS to a lower speed signal. The sampling unit 40 is preferably embodied by a limiting amplifier as known in the art.

The IC 10 might further comprise a clock data recovery unit 200 for deriving the clock signal CLK from a data signal. In the example of FIG. 1, the clock data recovery unit 200 derives the clock signal CLK from the comparator output signal COS, however, it might also use the comparator input signal, the input signal, or another signal derived from the input signal accordingly. The phase shifting unit 70 is coupled to the clock data recovery unit 200 and receives the recovered clock signal CLK therefrom. Instead or in addition, the IC 10 might also use the signal recovery scheme as outlined in the aforementioned European Patent Application No. 02017334.0.

A clock divider 210 might be coupled to the output of the phase shifting unit 70, it might be also part of the serializer—deserializer unit. An output of the clock divider 210 can be coupled to the bit error test unit 60 and/or other units (not shown in FIG. 1) in order to allow processing the data inside those units at the same speed the sampling unit is running.

While the various blocks in FIG. 1 are depicted as individual units, it goes without saying that one or more of those blocks can be combined or provided as integral parts.

What is claimed is:

1. An integrated circuit comprising:

a level comparator adapted for comparing a level of a comparator input signal with a comparison level and correspondingly providing a comparator output signal, a sampling unit coupled to the level comparator and being adapted for sampling the comparator output signal, a phase shifting unit being adapted to receive and phase-shift a clock signal and to provide to the sampling unit a phase-shifted clock signal for controlling a sampling point of the sampling unit, and a bit error test unit adapted to receive the sampled comparator output signal and to determine therefrom an indication of a bit error in a sequence of the sampled comparator output signal by comparing the sampled comparator output signal against an expected pattern.

2. The integrated circuit according to claim 1, further comprising:

a control unit being adapted to control at least one of the following:
the phase-shifting of the phase shifting unit,
the comparison level of the level comparator,
operation of the bit error test unit.

3. The integrated circuit according to claim 2, wherein the control unit is adapted to be controlled by at least one of the following:
the bit error test unit,
an interface unit adapted to be coupled to a unit external with respect to the integrated circuit.

4. The integrated circuit according to claim 1, further comprising at least one of:

an input unit adapted to receive an input signal from external with respect of the integrated circuit, wherein the input unit comprises:
the level comparator adapted to receiving as the comparator input signal the input signal, or a signal derived therefrom, and
the sampling unit;
a processing unit adapted to receive and process the sampled comparator output signal; and
an output unit adapted to receive a data signal from the processing unit, to derive therefrom an output signal, and to provide the output signal to external with respect of the integrated circuit.

5. The integrated circuit according to claim 1, wherein the level comparator is adapted to provide at least one of the following:
comparing the comparator input signal against a threshold value representing the comparison level,
comparing a normal signal of the comparator input signal against a complementary signal of the comparator input signal, with the complementary signal being complementary to the normal signal.

6. The integrated circuit according to claim 1, wherein the bit error test unit is adapted to provide at least one of the following:

determining as the bit error indication at least one of the following: the number of bits in the sequence, the number of errors detected in the sequence, the number of error free bits in the sequence, a value of a bit error rate representing the ratio of detected bit errors per number of bits, determining the bit error indication with respect to at least one of the sampling point, representing a point in time relative to transition time of the clock signal, and the comparison level of the level comparator, storing and/or buffering the bit error indication, communicating the bit error indication to at least one of: another unit of the integrated circuit, a unit external with respect to the integrated circuit.

7. The integrated circuit according to claim 1, further comprising an interface unit adapted to be coupled to an external bit error test processing unit being external with respect to the integrated circuit, the interface unit being adapted to provide at least one of the following:

communicating at least one of status information of the bit error test unit and the bit error indication to the external bit error test processing unit, receiving a control signal from the external bit error test processing unit in order to provide at least one of: controlling operation of the bit error test unit, initiating operation of the bit error test unit, controlling operation of the control unit.

8. The integrated circuit according to claim 1, comprising at least one of the features:

the sampling unit comprises a deserializer adapted for deserializing the comparator output signal, the integrated circuit further comprises a clock data recovery unit adapted to derive the clock signal from one of: the comparator input signal, the input signal, a signal derived from the input signal, and the comparator output signal, wherein the phase shifting unit is coupled to the clock data recovery unit and receives the recovered clock signal therefrom.

9. A method in an integrated circuit, the method comprising:

comparing a level of a comparator input signal with a comparison level and correspondingly providing a comparator output signal, sampling the comparator output signal, phase-shifting a clock signal for controlling a sampling point for sampling the comparator output signal, and determining from the sampled comparator output signal an indication of a bit error in a sequence of the sampled comparator output signal by comparing the sampled comparator output signal against an expected pattern.

10. A computer readable medium encoded with a software program for executing the method of claim 9 when run on a data processing system.

* * * * *